(12) United States Patent
Dai

(10) Patent No.: US 9,419,029 B1
(45) Date of Patent: Aug. 16, 2016

(54) METHOD FOR MANUFACTURING THIN FILM TRANSISTOR ARRAY SUBSTRATE AND THIN FILM TRANSISTOR ARRAY SUBSTRATE FOR THE SAME

(71) Applicant: SHENZHEN CHINA STAR OPTOELECTRONICS TECHNOLOGY CO., LTD., Shenzhen, Guangdong (CN)

(72) Inventor: Tianming Dai, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 188 days.

(21) Appl. No.: 14/381,403

(22) PCT Filed: May 16, 2014

(86) PCT No.: PCT/CN2014/077626
§ 371 (c)(1),
(2) Date: Aug. 27, 2014

(87) PCT Pub. No.: WO2015/168961
PCT Pub. Date: Nov. 12, 2015

(30) Foreign Application Priority Data

May 6, 2014 (CN) .......................... 2014 1 0188477

(51) Int. Cl.
*H01L 21/84* (2006.01)
*H01L 27/12* (2006.01)
(Continued)

(52) U.S. Cl.
CPC ...... *H01L 27/1288* (2013.01); *H01L 21/02532* (2013.01); *H01L 21/02675* (2013.01); *H01L 21/28088* (2013.01); *H01L 21/28158* (2013.01); *H01L 27/1296* (2013.01); *H01L 29/167* (2013.01); *H01L 29/401* (2013.01);
(Continued)

(58) Field of Classification Search
CPC ................... H01L 29/76875; H01L 29/66757; H01L 29/401; H01L 29/66492; H01L 29/167; H01L 29/466; H01L 21/28088; H01L 21/02675; H01L 21/28158; H01L 27/1288
See application file for complete search history.

(56) References Cited

U.S. PATENT DOCUMENTS

2002/0074550 A1 6/2002 Itoga et al.
2005/0266595 A1* 12/2005 Lee ..................... G02F 1/13454
438/30

(Continued)

FOREIGN PATENT DOCUMENTS

CN 1901168 A 1/2007
CN 101009331 A 8/2007
(Continued)

*Primary Examiner* — Richard Booth
(74) *Attorney, Agent, or Firm* — Ladas & Parry LLP

(57) ABSTRACT

A method for manufacturing a thin film transistor array substrate includes: forming a polysilicon layer on the substrate; forming a gate insulating layer on the polysilicon layer; forming a metal oxide layer on the gate insulating layer; forming a gate metal layer on the metal oxide layer; etching the metal oxide layer to define a gate; using the gate as a second mask and etching the metal oxide layer excluding a scope of the second mask; performing ion-implantation by using the gate and a remainder of the metal oxide layer as a third mask to form two lightly doped drain regions at opposite sides of the polysilicon layer; forming an insulating layer on the gate and the gate insulating layer respectively; forming a metal layer on the insulating layer and defining a drain and a source which connect to the doped drain region and the doped source region respectively.

20 Claims, 5 Drawing Sheets

(51) Int. Cl.
*H01L 29/786* (2006.01)
*H01L 21/28* (2006.01)
*H01L 29/66* (2006.01)
*H01L 29/40* (2006.01)
*H01L 29/167* (2006.01)
*H01L 21/02* (2006.01)
*H01L 29/49* (2006.01)

(52) U.S. Cl.
CPC ..... *H01L 29/4966* (2013.01); *H01L 29/66492* (2013.01); *H01L 29/66757* (2013.01); *H01L 29/78675* (2013.01); *H01L 2227/323* (2013.01)

(56) References Cited

U.S. PATENT DOCUMENTS

2007/0170526 A1  7/2007  Satou
2008/0044958 A1  2/2008  Hwang

FOREIGN PATENT DOCUMENTS

CN  101127328 A  2/2008
JP  2001-160549 A  6/2001

\* cited by examiner

METHOD FOR MANUFACTURING THIN FILM TRANSISTOR ARRAY SUBSTRATE AND THIN FILM TRANSISTOR ARRAY SUBSTRATE FOR THE SAME

FIELD OF THE INVENTION

The present invention relates to a method for manufacturing an array substrate and a structure for the same, and more particularly, to a method for manufacturing a low-temperature polysilicon thin film transistor array substrate and a structure of a low-temperature polysilicon thin film transistor array substrate.

BACKGROUND OF THE INVENTION

Liquid crystal displays having advantages over small size, light weight, and low power consumption are widely applied to various types of electronic products. In order to achieve high-precision components and pixel arrangement degrees, low-temperature polysilicon (LTPS) thin-film transistor liquid crystal displays have become the mainstream of development.

However, low-temperature polysilicon has a problem that the conventional low-temperature polysilicon thin film transistor (LTPS-TFT) structure comprises two n-doped regions formed on a polysilicon layer as a source and a drain. Since a doping concentration of the two n-doped regions is higher and a distance between the gate electrode and the n-doped region is very small, a strong electric field closing to the drain causes a hot carrier effect. Thus, a leakage current will occur while the polysilicon thin film transistor is in the OFF state. To solve this problem, the conventional technology uses a lightly doped drain (LDD) structure to reduce the electric field which is in contact with the drain and thus reduce the leakage current. Referring to FIG. 1, in the process of manufacturing a conventional low-temperature polysilicon thin film transistor, the formation of a self-aligned lightly doped drain structure thin film transistor array substrate as below: 1. forming a buffer layer 11 and a non-polysilicon layer on a substrate 10, the non-polysilicon layer crystallized into a polysilicon layer 12 by an excimer laser annealing process, and defining a polysilicon region by a mask; 2. defining a n-doped region by the mask and performing a ion-implantation process to implant ions to form the n-doped region; 3. forming a gate insulating layer 14 on the polysilicon layer 12 by a plasma-enhanced chemical vapor deposition process; 4. forming a gate 15 on the gate insulating layer 14, and defining a gate region by the mask, etching other metal by a dry etching process; 5. performing the ion-implantation process (shown by the arrow in FIG. 1) and using the gate 15 as the mask to form a lightly doped drain region 16.

By etching the gate with the dry etching process, the gate insulating layer will also be etched and the gate insulating layer will be lost. While performing the ion-implantation process to form the lightly doped drain region, the ions implanted into the polysilicon layer will cause the dosage of the ions to be uneven. Thus, the electric properties of each where of the a channel of the thin-film transistor produces differences and results in the brightness of liquid crystal display being uneven or dark spots may occasionally appear on the liquid crystal display.

SUMMARY OF THE INVENTION

An objective of the present invention is to provide a method of manufacturing a thin film transistor array substrate and a structure of a thin film transistor array substrate for preventing the loss of the gate insulating layer when performing the dry etching process on the gate. The present invention improves the ion dose uniformity of the thickness of the gate insulating layer, so that the ions implanted into the lightly doped drain will remain consistent.

In order to achieve the aforementioned objective of the present invention, the present invention provides a method of manufacturing a thin film transistor array substrate, comprising:

providing a substrate;
forming a polysilicon layer on the substrate;
forming a doped drain region and a doped source region in the polysilicon layer;
forming a gate insulating layer on the polysilicon layer;
forming a metal oxide layer on the gate insulating layer;
forming a gate metal layer on the metal oxide layer;
etching the metal oxide layer by using a first mask to define a gate;
using the gate as a second mask and etching the metal oxide layer excluding a scope of the second mask;
performing ion-implantation by using the gate and a remainder of the metal oxide layer as a third mask to form two lightly doped drain regions at the opposite sides of the polysilicon layer, the two lightly doped drain region are in contact with the doped drain region and the doped source region respectively;
forming an insulating layer on the gate and the gate insulating layer respectively, and defining a via hole on the doped drain region and the doped source region respectively;
forming a metal layer on the insulating layer and defining a drain and a source, the drain and the source being connected to the doped drain region and the doped source region respectively through the via hole.

In the method described above, the method further comprises a step of forming a buffer layer on the substrate before forming the polysilicon layer on the substrate.

In the method described above, a plurality of phosphorous ions are ion-implanted into the polysilicon layer to form the doped drain region and the doped source region.

In the method described above, the step of etching the gate metal layer comprises a dry etching process which is configured to etch the gate metal layer excluding a scope of the first mask to form the gate, and the step of etching the metal oxide layer comprises a wet etching process which is configured to etch the metal oxide layer by using the gate as the second mask excluding the scope of the second mask.

In the method described above, the gate insulating layer is selected from one of a silicon oxide layer, a silicon nitride layer, or a stacked layer structure for both of the layers.

In the method described above, the metal oxide layer is made of Indium Tin Oxide.

In the method described above, a critical dimension bias between the metal oxide layer and the gate is less than 0.3 µm.

In the method described above, the method is for use in manufacturing an organic light emitting diode display.

The present invention further provides a method of manufacturing a thin film transistor array substrate, comprising:

providing a substrate;
forming a polysilicon layer on the substrate;
forming a doped drain region and a doped source region in the polysilicon layer;
forming a gate insulating layer on the polysilicon layer;
forming a metal oxide layer on the gate insulating layer;
forming a gate metal layer on the metal oxide layer;
etching the metal oxide layer by using a first mask to define a gate;

using the gate as a second mask and etching the metal oxide layer excluding a scope of the second mask;

performing ion-implantation by using the gate and a remainder of the metal oxide layer as a third mask to form two lightly doped drain regions at the opposite sides of the polysilicon layer;

forming an insulating layer on the gate and the gate insulating layer respectively, and defining a via hole on the doped drain region and the doped source region respectively;

forming a metal layer on the insulating layer and defining a drain and a source, the drain and the source being connected to the doped drain region and the doped source region respectively through the via hole.

In the method described above, the method further comprises a step of forming a buffer layer on the substrate before forming the polysilicon layer on the substrate.

In the method described above, a plurality of phosphorous ions are ion-implanted into the polysilicon layer to form the doped drain region and the doped source region.

In the method described above, the step of etching the gate metal layer comprises a dry etching process which is configured to etch the gate metal layer excluding a scope of the first mask to form the gate, and the step of etching the metal oxide layer comprises a wet etching process which is configured to etch the metal oxide layer by using the gate as the second mask excluding the scope of the second mask.

In the method described above, the gate insulating layer is selected from one of a silicon oxide layer, a silicon nitride layer, or a stacked layer structure for both of the layers.

In the method described above, the metal oxide layer is made of Indium Tin Oxide.

In the method described above, a critical dimension bias between the metal oxide layer and the gate is less than 0.3 µm.

In the method described above, the method is for use in manufacturing an organic light emitting diode display.

The present invention further provides a thin film transistor array substrate, comprising:

a substrate, a polysilicon layer formed on the substrate, a gate insulating layer formed on the polysilicon layer, a gate formed on the gate insulating layer, the polysilicon layer having a doped drain region and a doped source region and two lightly doped drain regions at the opposite sides of the polysilicon layer, an insulating layer formed on the gate and the gate insulating layer respectively, a via hole formed on the doped drain region and the doped source region respectively, a metal layer formed on the insulating layer, the metal layer having a drain and a source, the drain and the source connected to the doped drain region and the doped source region respectively through the via hole;

wherein a metal oxide layer is formed between the gate and the gate insulating layer, an overlying scope of the gate is the same as an overlying scope of the metal oxide layer, the two lightly doped drain regions are not covered by the overlying scope of the gate and the overlying scope of metal oxide layer.

In the substrate described above, a buffer layer is formed between the substrate and the polysilicon layer.

In the substrate described above, the metal oxide layer is made of Indium Tin Oxide.

In the substrate described above, a critical dimension bias between the metal oxide layer and the gate is less than 0.3 µm.

DETAILED DESCRIPTION OF THE PREFERRED EMBODIMENTS

The preferred embodiments adopted by the present invention are given in the following detailed description, with reference to the drawings.

Figure 1:
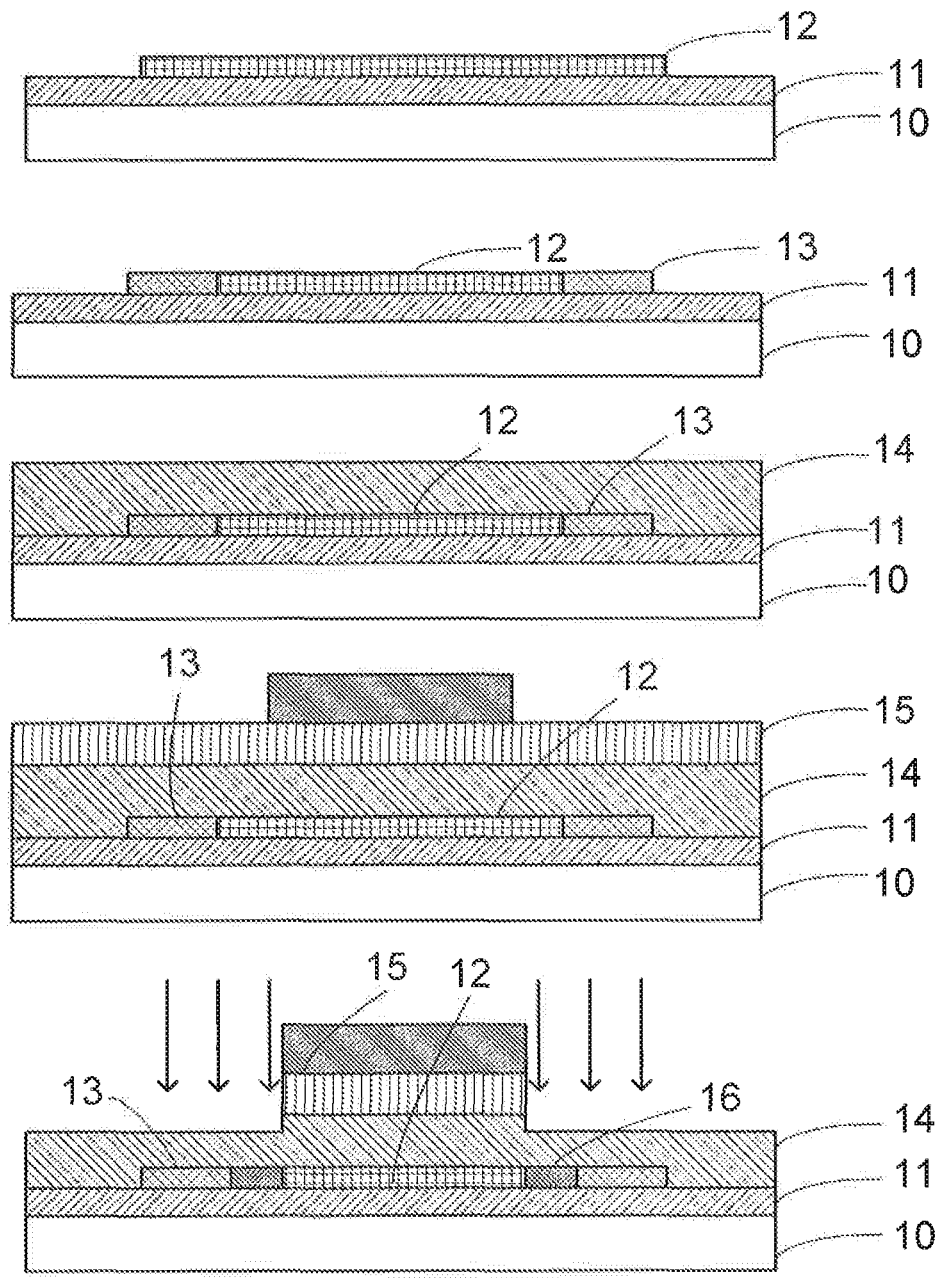
FIG. 1 is a schematic view and process of the conventional low-temperature polysilicon thin film transistor.
Figure 2:
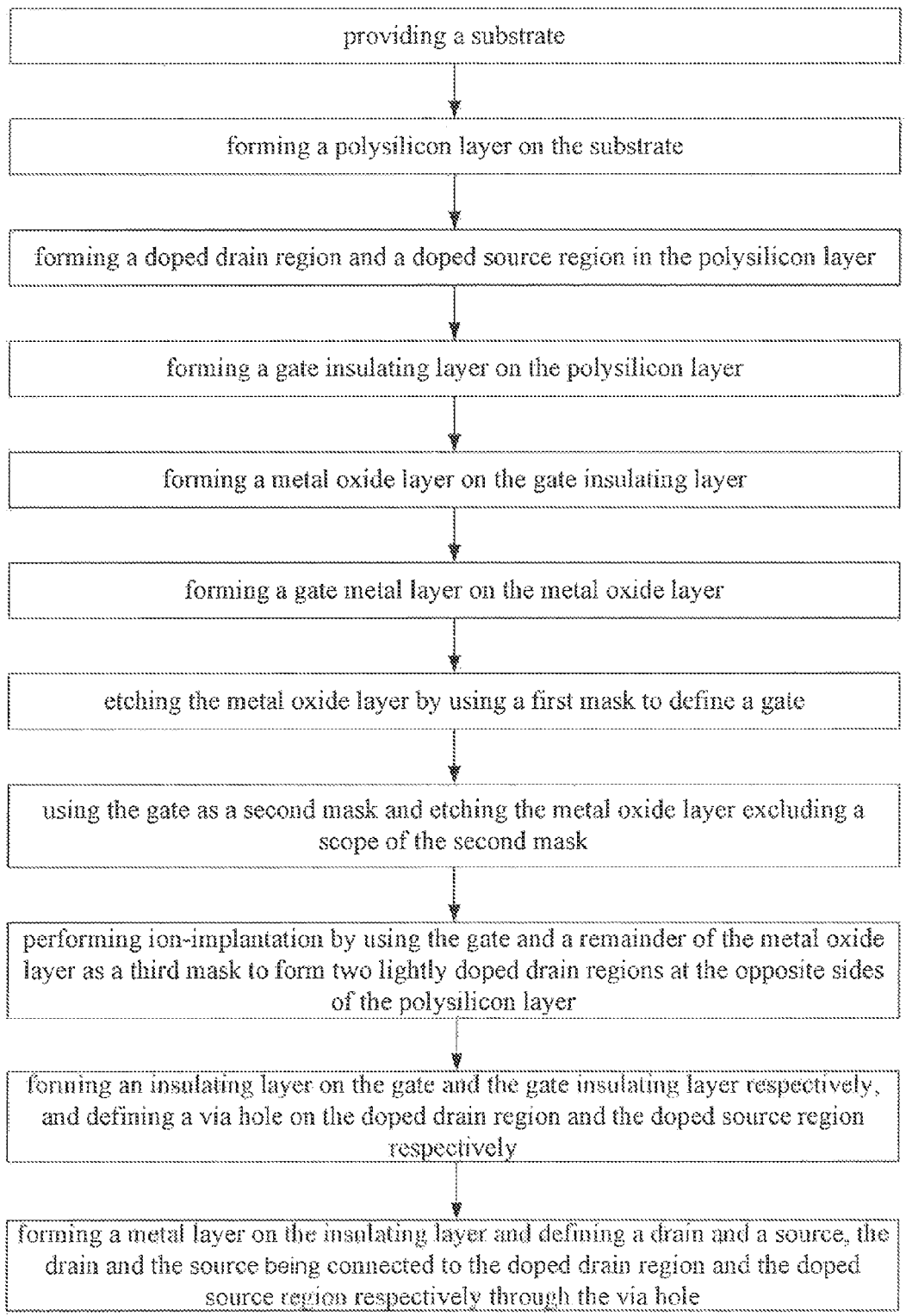
FIG. 2 is a flowchart of a method of manufacturing thin film transistor array substrate according to a preferred embodiment of the present invention.
Figure 3:
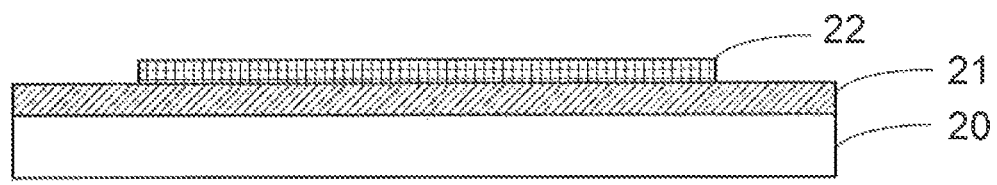
FIG. 3-FIG. 9 illustrate schematic views and processes of the thin film transistor array substrate according to the preferred embodiment of the present invention.
Figure 4:
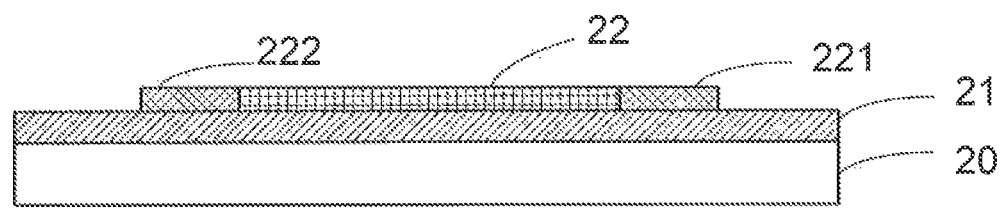
Figure 5:
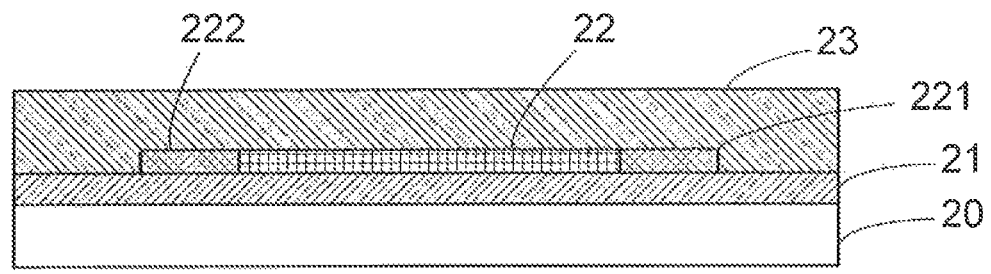
Figure 6:
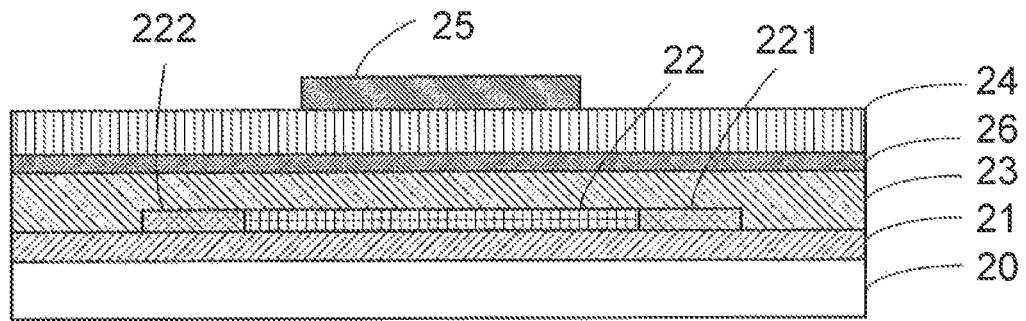

FIG. 2 is a flowchart of a method of manufacturing thin film transistor array substrate according to a preferred embodiment of the present invention, which comprises; providing a substrate which is made of transparent conductive material, such as glass, quartz, or the like which can be used for the substrate.

A polysilicon layer is formed on the substrate. Before forming the polysilicon layer, a non-polysilicon layer formed on a substrate which is crystallized into the polysilicon layer by an excimer laser annealing process to convert the non-polysilicon layer into the polysilicon layer as a channel region of the thin-film transistor. A polysilicon region (not shown) is defined by a masking and an etching process. In other embodiment of the present invention, the method further comprises a step of forming a buffer layer on the substrate before forming the polysilicon layer on the substrate.

The polysilicon layer is to apply a photoresist onto and apply a back surface light exposure process to the substrate for defining a photoresist pattern on the polysilicon layer, then performing an ion-implantation by using the photoresist pattern as a mask to form a doped drain region and a doped source region in the polysilicon layer. In an n-type thin film transistor, the ion-implantation uses ions selected from pentavalent ions, such as phosphorus ion or arsenic ion. In a p-type thin film transistor, the ion-implantation uses ions selected from trivalent ions, such as boron ion and gallium ion. In this embodiment of the present invention, phosphorus ion implanted in the polysilicon region of the polysilicon layer to form the doped drain region and the doped source region which are formed at the opposite sides of the polysilicon layer respectively.

A gate insulating layer is formed on the polysilicon layer by performing a plasma-enhanced chemical vapor deposition process. In this embodiment of the present invention, the gate insulating layer is selected from one of a silicon oxide layer, a silicon nitride layer, or a stacked layer structure for both of the layers, but not limited thereto.

A metal oxide layer is formed on the gate insulating layer. Preferably, the metal oxide layer is made of Indium Tin Oxide, but is not limited thereto.

A gate metal layer is formed on the metal oxide layer. Using a first mask to define a gate region (not shown), and performing an etching process toward the metal oxide layer to define a gate. In this embodiment of the present invention, the step of etching the gate metal layer comprises a dry etching process which is configured to etch the gate metal layer excluding a scope of the first mask to form the gate. The reason for performing the dry etching process is mainly due to the number of pulses per inch (ppi) being high, a critical dimension bias in the dry etching process will be smaller than the critical dimension bias in a wet etching process.

Then, the gate is used as a second mask and the metal oxide layer is etched excluding a scope of the second mask. In this embodiment of the present invention, the step of etching the metal oxide layer comprises a wet etching process which is configured to etch the metal oxide layer by using the gate as the second mask excluding the scope of the second mask.

Then, ion-implantation is performed by using the gate and a remainder of the metal oxide layer as a third mask to form two lightly doped drain regions at opposite sides of the polysilicon layer. The remainder of the metal oxide layer is formed between the gate and the gate insulating layer. Furthermore, an overlying scope of the gate is the same as an overlying scope of the remainder of the metal oxide layer. Namely, the ion-implantation uses the gate and a remainder of the metal oxide layer as the third mask. Thus, the overlying scope of the gate and the overlying scope of the remainder of the metal oxide layer do not cover with the lightly doped drain regions. The lightly doped drain regions are out of the overlying scope of the gate and the overlying scope of the remainder of the metal oxide layer. The two lightly doped drain regions are in contact with the doped drain region and the doped source region respectively so as to achieve the effect of self-aligning and further to control a shift (critical dimension bias) between the gate and the remainder of the metal oxide layer, as the third mask is less than 0.3 μm for preventing the critical dimension bias and not does affect a width of the gate.

The follow steps form an insulating layer on the gate and the gate insulating layer respectively, forming a metal layer on the insulating layer and defining a drain and a source, and forming a via hole by using a mask in the insulating layer corresponding to the drain and the source respectively. The doped drain region and the doped source region of the polysilicon layer correspond to the via hole respectively. The drain and the source connect to the doped drain region and the doped source region respectively through the via hole.

In addition, referring to FIG. 3-FIG. 9, the present invention provides a thin film transistor array substrate, which comprises: a substrate 20, a polysilicon layer 22 formed on the substrate 20, a gate insulating layer 23 formed on the polysilicon layer 22, a gate 24 formed on the gate insulating layer 23, the polysilicon layer 22 having a doped drain region 221 and a doped source region 222 and two lightly doped drain regions 30 at the opposite sides of the polysilicon layer 22, an insulating layer 25 formed on the gate 24 and the gate insulating layer 23 respectively, a via hole 27 formed in the insulating layer 25 and corresponding to the doped drain region 221 and the doped source region 222 respectively, a metal layer 28 formed on the insulating layer 25, the metal layer 28 having a drain 281 and a source 282, the drain 281 and the source 282 connect to the doped drain region 221 and the doped source region 222 respectively through the via hole 27.

A metal oxide layer 26 is formed between the gate 24 and the gate insulating layer 23, an overlying scope of the gate 24 is the same as an overlying scope of the metal oxide layer 26, the two lightly doped drain regions 30 are not covered by the overlying scope of the gate 24 and the overlying scope of metal oxide layer 26.

Figure 7:
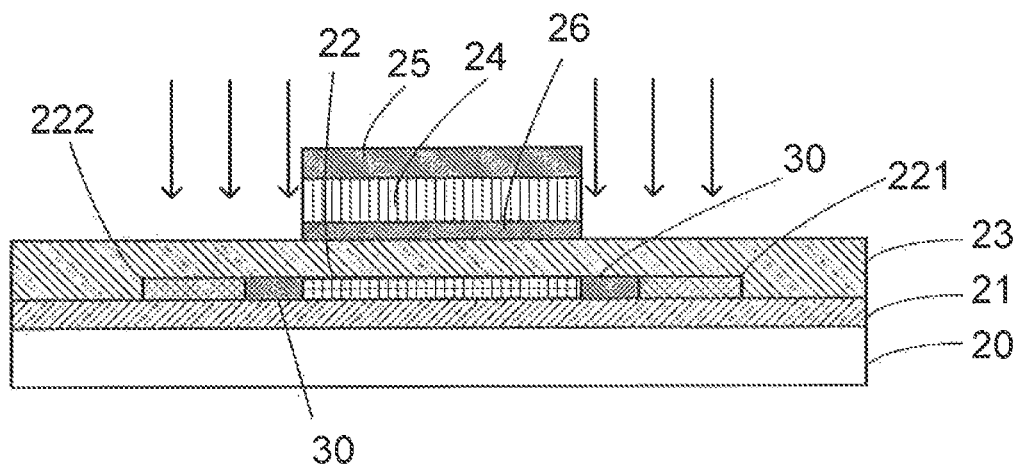
Figure 8:
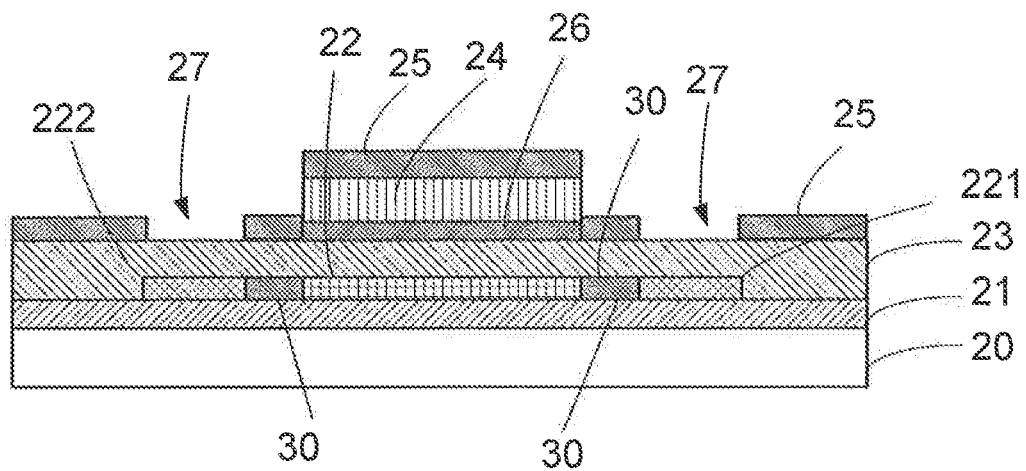
Figure 9:
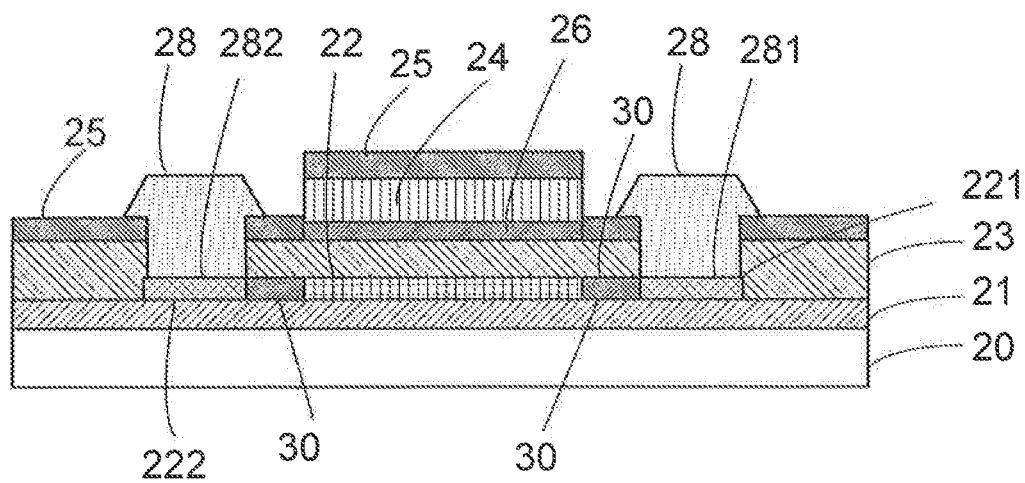

Preferably, in this embodiment of the present invention, the thin film transistor array substrate uses the gate 24 and the metal oxide layer 26 as the mask to perform the ion-implantation toward the lightly doped drain regions 30 (shown by the arrow of FIG. 7). Referring to FIG. 7 and observing from a vertical direction, the gate 24, the metal oxide layer 26 and the lightly doped drain regions 30 are aligned with each other. The overlying scope of the gate 24 and the overlying scope of the metal oxide layer 26 do not cover with the lightly doped drain regions 30.

Preferably, the metal oxide layer 26 is made of Indium Tin Oxide. A critical dimension bias between the metal oxide layer 26 and the gate 24 is less than 0.3 μm. The thin film transistor array substrate is for use in manufacturing an organic light emitting diode display.

In another embodiment of the present invention, a buffer layer formed between the substrate and the polysilicon layer.

As described above, the present invention provides a method of manufacturing a thin film transistor array substrate and a thin film transistor array substrate. The metal oxide layer is disposed under the gate so that the metal oxide layer resists the etching to the gate insulating layer when the gate performs the dry etching process. This can improve the uniformity of the gate insulating layer, and the critical dimension bias between the gate and the metal oxide layer is less than 0.3 μm for preventing the loss of the gate insulating layer when performing the dry etching process to the gate. The present invention also can provide better uniformity of the ion-implantation of the lightly doped drain regions in depth and dosage and ensure that the ion dosage implanted into the lightly doped drain regions remain consistent. Thus, the present invention prevents the ion dosage implanted into the lightly doped drain regions from being uneven and causes the electric property of each where of the a channel of the thin-film transistor produces differences and resulting in the brightness of liquid crystal display being uneven or dark spots may occasionally appear on the liquid crystal display.

Although the present invention has been described with the preferred embodiments thereof, those skilled in the art will appreciate that various modifications, additions, and substitutions are possible, without departing from the scope and the spirit of the invention. Accordingly, the scope of the present invention is intended to be defined only by reference to the claims.

What is claimed is:

1. A method for manufacturing a thin film transistor array substrate, comprising:
   providing a substrate;
   forming a polysilicon layer on the substrate;
   forming a doped drain region and a doped source region in the polysilicon layer;
   forming a gate insulating layer on the polysilicon layer;
   forming a metal oxide layer on the gate insulating layer;
   forming a gate metal layer on the metal oxide layer;
   etching the metal layer by using a first mask to define a gate;
   using the gate as a second mask and etching the metal oxide layer excluding a scope of the second mask;
   performing ion-implantation by using the gate and a remainder of the metal oxide layer as a third mask to form two lightly doped drain regions at opposite sides of the polysilicon layer, the two lightly doped drain region being in contact with the doped drain region and the doped source region respectively;
   forming an insulating layer on the gate and the gate insulating layer respectively, and defining a via hole on the doped drain region and the doped source region respectively;
   forming a metal layer on the insulating layer and defining a drain and a source, the drain and the source being connected to the doped drain region and the doped source region respectively through the via hole.

2. The method according to claim 1, further comprising a step of forming a buffer layer on the substrate before forming the polysilicon layer on the substrate.

3. The method according to claim 1, wherein a plurality of phosphorous ions are ion-implanted into the polysilicon layer to form the doped drain region and the doped source region.

4. The method according to claim 1, wherein the step of etching the gate metal layer comprises a dry etching process which is configured to etch the gate metal layer excluding a scope of the first mask to form the gate, and the step of etching the metal oxide layer comprises a wet etching process which is configured to etch the metal oxide layer by using the gate as the second mask excluding the scope of the second mask.

5. The method according to claim 1, wherein the gate insulating layer is selected from one of a silicon oxide layer, a silicon nitride layer, or a stacked layer structure for both of the layers.

6. The method according to claim 1, wherein the metal oxide layer is made of Indium Tin Oxide.

7. The method according to claim 1, wherein a critical dimension bias between the metal oxide layer and the gate is less than 0.3 μm.

8. The method according to claim 1 being for use in manufacturing an organic light emitting diode display.

9. A method for manufacturing a thin film transistor array substrate, comprising:
  providing a substrate;
  forming a polysilicon layer on the substrate;
  forming a doped drain region and a doped source region in the polysilicon layer;
  forming a gate insulating layer on the polysilicon layer;
  forming a metal oxide layer on the gate insulating layer;
  forming a gate metal layer on the metal oxide layer;
  etching the metal layer by using a first mask to define a gate;
  using the gate as a second mask and etching the metal oxide layer excluding a scope of the second mask;
  performing ion-implantation by using the gate and a remainder of the metal oxide layer as a third mask to form two lightly doped drain regions at the opposite sides of the polysilicon layer;
  forming an insulating layer on the gate and the gate insulating layer respectively, and defining a via hole on the doped drain region and the doped source region respectively;
  forming a metal layer on the insulating layer and defining a drain and a source, the drain and the source being connected to the doped drain region and the doped source region respectively through the via hole.

10. The method according to claim 9 further comprising a step of forming a buffer layer on the substrate before forming the polysilicon layer on the substrate.

11. The method according to claim 9, wherein a plurality of phosphorous ions are ion-implanted into the polysilicon layer to form the doped drain region and the doped source region.

12. The method according to claim 9, wherein the step of etching the gate metal layer comprises a dry etching process which is configured to etch the gate metal layer excluding a scope of the first mask to form the gate, and the step of etching the metal oxide layer comprising a wet etching process which is configured to etch the metal oxide layer by using the gate as the second mask excluding the scope of the second mask.

13. The method according to claim 9, wherein the gate insulating layer is selected from one of a silicon oxide layer, a silicon nitride layer, or a stacked layer structure for both of the layers.

14. The method according to claim 9, wherein the metal oxide layer s made of Indium Tin Oxide.

15. The method according to claim 9, wherein a critical dimension bias between the metal oxide layer and the gate is less than 0.3 μm.

16. The method according to claim 9 being for use in manufacturing an organic light emitting diode display.

17. A thin film transistor array substrate, comprising:
  a substrate, a polysilicon layer formed on the substrate, a gate insulating layer formed on the polysilicon layer, a gate formed on the gate insulating layer, the polysilicon layer having a doped drain region and a doped source region and two lightly doped drain regions at opposite sides of the polysilicon layer, an insulating layer formed on the gate and the gate insulating layer respectively, a via hole formed on the doped drain region and the doped source region respectively, a metal layer formed on the insulating layer, the metal layer having a drain and a source, the drain and the source connected to the doped drain region and the doped source region respectively through the via hole;
  wherein a metal oxide layer is formed between the gate and the gate insulating layer, an overlying scope of the gate is the same as an overlying scope of the metal oxide layer, the two lightly doped drain regions are not covered by the overlying scope of the gate and the overlying scope of metal oxide layer.

18. The thin film transistor array substrate according to claim 17, further comprising a buffer layer formed between the substrate and the polysilicon layer.

19. The thin film transistor array substrate according to claim 17, wherein the metal oxide layer is made of Indium Tin Oxide.

20. The thin film transistor array substrate according to claim 17, wherein a critical dimension bias between the metal oxide layer and the gate is less than 0.3 μm.

* * * * *